United States Patent
Tal et al.

[11] Patent Number: 5,909,384
[45] Date of Patent: Jun. 1, 1999

[54] SYSTEM FOR DYNAMICALLY ADAPTING THE LENGTH OF A FILTER

[75] Inventors: Nir Tal, Haifa; Nir Shapira; Ron Cohen, both of Ramat Hasharon, all of Israel

[73] Assignee: Conexant Systems, Inc., Newport Beach, Calif.

[21] Appl. No.: 08/726,187

[22] Filed: Oct. 4, 1996

[51] Int. Cl.[6] .................................................. G06F 17/10
[52] U.S. Cl. ................................ 364/724.19; 370/290
[58] Field of Search ........................... 364/724.19, 724.2, 364/724.011; 370/289, 290; 379/410, 411, 416; 382/261

[56] References Cited

U.S. PATENT DOCUMENTS

| | | | |
|---|---|---|---|
| 4,823,382 | 4/1989 | Martinez | 379/411 |
| 4,935,919 | 6/1990 | HIveguchi | 370/290 |
| 4,995,030 | 2/1991 | Helt | 370/290 |
| 5,473,686 | 12/1995 | Virdee | 379/410 |
| 5,535,150 | 7/1996 | Chiang | 364/724.19 |
| 5,553,014 | 9/1996 | DeLeón, II et al. | 364/724.19 |
| 5,653,234 | 8/1997 | Kim et al. | 382/264 |

*Primary Examiner*—Emmanuel L. Moise
*Attorney, Agent, or Firm*—Darby & Darby

[57] ABSTRACT

A novel system by which the utilization of a central processing unit (CPU) in performing filtering operations can be reduced by shortening the filter's length thus degrading the performance of the system down to a predetermined level or threshold. The present invention is applicable to such systems that incorporate filters whereby shortening their length decreases the performance of the system and to such systems where a reliable quality criteria exists that can be measured during run time. A method iteratively minimizes the filter's length so that the quality criteria does not fall below a predetemined threshold level. In addition, a signal to noise ratio (SN) criteria is suggested for estimating the quality of the reception of communication signals. An implementation is suggested for the method in the particular case of an echo cancellation adaptive filter. In addition, a method for determining an immediate approximation of the echo canceler filter's length as opposed to finding it iteratively.

12 Claims, 8 Drawing Sheets

SYSTEM FOR DYNAMICALLY ADAPTING THE LENGTH OF A FILTER

FIELD OF THE INVENTION

The present invention relates generally to communications systems and more particularly relates to apparatus and methods for dynamically adapting the length of a digital communication filter.

BACKGROUND OF THE INVENTION

Traditional fall duplex communications systems are typically implemented using dedicated DSP-based hardware. Such modem implementation schemes are usually quite expensive due to the dedicated DSP hardware utilized. Therefore, the recent trend in the personal computer (PC) industry is to implement modems by exploiting the general purpose CPU built into each PC without the need for additional processing hardware. Such implementation schemes are termed Native Signal Processing (NSP).

Implicit in any NSP based modem design is the requirement that the modem share CPU time with other tasks executed in the PC system on the same processing unit. Hence, the great importance in minimizing CPU utilization of the NSP software functions using both novel DSP algorithms and hand coded assembly language optimizations.

Most modem implementations, whether NSP or DSP based, utilize one or more finite impulse response (FIR) adaptive filters to perform various filtering functions. Examples of applications of FIR adaptive filters include the far-end (FE) echo canceler FIR filter, the near-end echo (NE) echo canceler FIR filter and the equalizer (EQU) FIR filter. Each filter is constructed to have a particular number of taps or delay units. Generally, the larger the number of taps the better the filter performs its filtering function. However, the price is increased processing time.

In addition, the communication systems the modems are employed in are usually required to cope with a vast number of diverse channel and echo impairments. The length of a communications filter needed to retain a given performance curve depends on the amount of signal distortion introduced by the channel and the echo impairments. Usually, the greater the distortion that is present in the channel, the longer the filter that is needed to cancel it. Since the communication system must be able to cope with the worst case impairment conditions, and since the distortion characteristics are not known a priori, prior art modems which use fixed length filters must employ a long filter length to meet the worst case requirements regardless of the actual signal distortion. However, since worst case distortion conditions are quite rare, a fixed length filter implementation usually results in wasted consumption of CPU resources.

Modifying the length of a digital filter for producing optimal acoustic echo cancellation is known in the art. U.S. Pat. No. 5,473,686 issued to Virdee teaches modifying the number of taps of an adaptive finite impulse response (AFIR) to achieve optimal echo cancellation. The taps at the end of the filter are examined as to whether they contribute a first threshold amount to the echo estimate. If not, the number of samples is reduced and the taps at the end of the filter are checked again. If the taps at the end of the filter contribute more than a second threshold amount, the number of samples is increased and the process is repeated.

SUMMARY OF THE INVENTION

Accordingly, it is an object of the present invention to provide a method of dynamically adapting the length of a filter in accordance with predetermined criterion.

Another object of the present invention is to provide a method by which central processing unit (CPU) utilization can be reduced by degrading system performance down to a predetermined threshold level through the shortening of the filter's length.

It is another object of the present invention to provide a method of dynamically adapting the length of a filter such that the output of the filter remains coherent during the process of shortening or lengthening the length of the filter.

Another object of the present invention is to provide a method of dynamically adapting the length of a filter whereby the filter's length is minimized without the quality criteria falling below a predetermined set of thresholds.

Yet another object of the present invention is to provide a method of dynamically adapting the length of a filter which provides an immediate approximation of a filter's length in accordance with selected quality criteria.

It is another object of the present invention to provide a method of dynamically adapting the length of a filter which can vary the length of the filter's coefficients vector by either removing coefficients from the filter's head, adding coefficients to the filter's head, removing coefficients from the filter's tail or adding coefficients to the filter's tail without disturbing the coherence of the signal at the filter's output, i.e., not losing or corrupting any samples from the filter's input or output.

The present invention includes several methods for dynamically adapting the length of a filter. The methods of the present invention are applicable to systems that (1) include filters such that the shortening of their length decreases the performance of the system and (2) a reliable quality criteria can be measured during run time of the system. The methods are demonstrated using as an example the far-end echo canceler filter in the ITU V0.32bis 14,400 bps modem. It is noted that the methods taught by the present invention are applicable to not only other filters in the modem but to communication filters in other applications as well. Example of other communications filters used in a modem include the equalizer filter which performs inter symbol interference (ISI) cancellation, the near-end echo canceler and the matched filter.

For purposes of teaching the methods of the present invention, however, the present invention is described in the context of a far-end filter because this type of filter yields relatively good results in terms of CPU utilization due to the large dynamic range of the length of the far-end filter in various impairment conditions. One of the methods taught by the present invention can be generalized to any type of variable length filter where some parameter exists in the system that can be measured in response to changes in the filter's length. Typically, this parameter will be related to the signal to noise ratio of some point in the system that is responsive to changes in the length of the filter.

In addition to minimizing wasted processing, another benefit of eliminating unnecessary filter taps is that the residual error at the filter's output is reduced. Also, eliminating unnecessary filter taps provides a vast improvement in the convergence time of the filter algorithm used to calculate the tap coefficients, for example the least mean squares (LMS) algorithm.

The methods of the present invention are based on the principle that a certain amount of bit error rate (BER) at the output of the receiver can be tolerated. The BER is in turn directly related to the signal-to-noise ratio (SNR) at the output of the slicer in the receiver. Thus, there exists a maximum allowable BER which translates to a minimum allowable SNR. This minimum allowable SNR becomes a threshold value which is used as the metric to determine how many filter taps can be removed without dropping below the minimum threshold SNR. The present invention suggests two methods for adapting the length of a filter in accordance with a measurement of the SNR within the system, e.g., measured at the output of a slicer in a receiver.

There is thus provided in accordance with a preferred embodiment of the present invention a method of dynamically adjusting the length of a digital filter having a plurality of taps, the digital filter utilized in a system wherein the system has at least one measurable quality criteria Q, the method comprising the steps of measuring the at least one measurable quality criteria in the system, comparing the measured at least one quality criterion against a predetermined threshold, removing M taps from the digital filter and repeating the steps of measuring and comparing if the measured at least one quality criteria is above the predetermined threshold, and adding M taps to the digital filter if the measured at least one quality criteria is below the predetermined threshold.

The at least one quality criteria is a measurable signal to noise ratio at a point within the system.

There is also provided in accordance with a preferred embodiment of the present invention a method of dynamically adjusting the length of an adaptive digital filter (ADF) having an adaptation procedure and a plurality of taps, the ADF utilized in a system wherein the system has at least one measurable quality criteria Q, the method comprising the steps of waiting for the adaptation procedure of the ADF to converge, measuring the at least one measurable quality criteria in the system, comparing the measured at least one quality criteria against a predetermined threshold, removing M taps from the ADF and repeating the steps of measuring and comparing if the measured at least one quality criteria is above the predetermined threshold, and adding M taps to the ADF if the measured at least one quality criteria is below the predetermined threshold.

Further, there is provided in accordance with a preferred embodiment of the present invention a method of dynamically adjusting the length of an adaptive digital filter (ADF) having a plurality of taps, the plurality of taps having an associated set of filter coefficients, the ADF utilized in a system wherein the system has at a measurable signal to noise ration (SNR), the method comprising the steps of waiting for the ADF to converge, measuring the SNR, storing the filter coefficients, comparing the measured SNR against a predetermined threshold, removing M taps from the ADF and repeating the steps of measuring and comparing if the measured SNR is above the predetermined threshold, and restoring the filter coefficients previously stored if the measured SNR is below the predetermined threshold.

There is also provided in accordance with a preferred embodiment of the present invention a method of dynamically adjusting the length of a least mean squares (LMS) echo canceler initially having $L_{max}$ number of taps, the echo canceler utilized in a system wherein the system has at least one measurable quality criteria Q, the method comprising the steps of waiting for the echo canceler to converge, the echo canceler utilizing the $L_{max}$ number of taps, measuring the at least one measurable quality criteria in the system, comparing the measured at least one quality criteria against a predetermined threshold, removing M taps from the ADF and repeating the steps of waiting, measuring and comparing if the measured at least one quality criteria is above the predetermined threshold, and adding M taps to the ADF if the measured at least one quality criteria is below the predetermined threshold.

The at least one quality criteria comprises the signal to noise ration (SNR) at the output of a slicer within the system.

In addition, there is provided in accordance with a preferred embodiment of the present invention a method of dynamically adjusting the length of an adaptive echo canceler initially having $L_{max}$ number of taps, the taps having an associated set of filter coefficients, the echo canceler utilized in a system wherein the system comprises a measurable signal to noise ratio (SNR) and echo to signal ratio (ESR), the method comprising the steps of waiting for the echo canceler to converge, the echo canceler utilizing the $L_{max}$ number of taps, measuring the old SNR, called $SNR_{old}$, at a suitable point within the system, measuring the ESR at a second suitable point within the system, calculating a percentage of energy that can be removed from the echo canceler, and removing M taps from the echo canceler in accordance with the calculated percentage of energy.

Also there is provided in accordance with a preferred embodiment of the present invention, in a digital filter having a length fir_len representing the number of taps and associated coefficients, a pointer to the first coefficient represented by fir_coefs_ptr, the filter having a head and a tail, the filter processing a set of data samples wherein a pointer data_ptr points to the next sample to be processed, a method of removing M taps from the head of the filter, the method comprising the steps of decrementing the filter length fir_len by M, incrementing the pointer to the first coefficient fir_coefs_ptr by M, and incrementing the data pointer data_ptr by M.

In addition, there is provided in accordance with a preferred embodiment of the present invention, in a digital filter having a length fir_len representing the number of taps and associated coefficients, a pointer to the first coefficient represented by fir_coefs_ptr, the filter having a head and a tail, the filter 'processing a set of data samples wherein a pointer data_ptr points to the next sample to be processed, a method of removing M taps from the tail of the filter, the method comprising the step of decrementing the filter length fir_len by M.

Additionally, there is provided in accordance with a preferred embodiment of the present invention, in a digital filter having a length fir_len representing the number of taps and associated coefficients, a pointer to the first coefficient represented by fir_coef_sptr, the filter having a head and a tail, the filter processing a set of data samples wherein a pointer data_ptr points to the next sample to be processed, a method of adding M taps to the head of the filter, the method comprising the steps of incrementing the filter length fir_len by M, decrementing the pointer to the first coefficient fir_coefs_ptr by M, and decrementing the data pointer data_ptr by M.

Further, there is provided in accordance with a preferred embodiment of the present invention, in a digital filter having a length fir_len representing the number of taps and associated coefficients, a pointer to the first coefficient represented by fir_coefs_ptr, the filter having a head and a tail, the filter processing a set of data samples wherein a pointer data_ptr points to the next sample to be processed, a method of adding M taps to the tail of the filter, the method comprising the step of incrementing the filter length fir_len by M.

BRIEF DESCRIPTION OF THE DRAWINGS

The invention is herein described, by way of example only, with reference to the accompanying drawings, wherein.

DETAILED DESCRIPTION OF THE INVENTION

Figure 1:
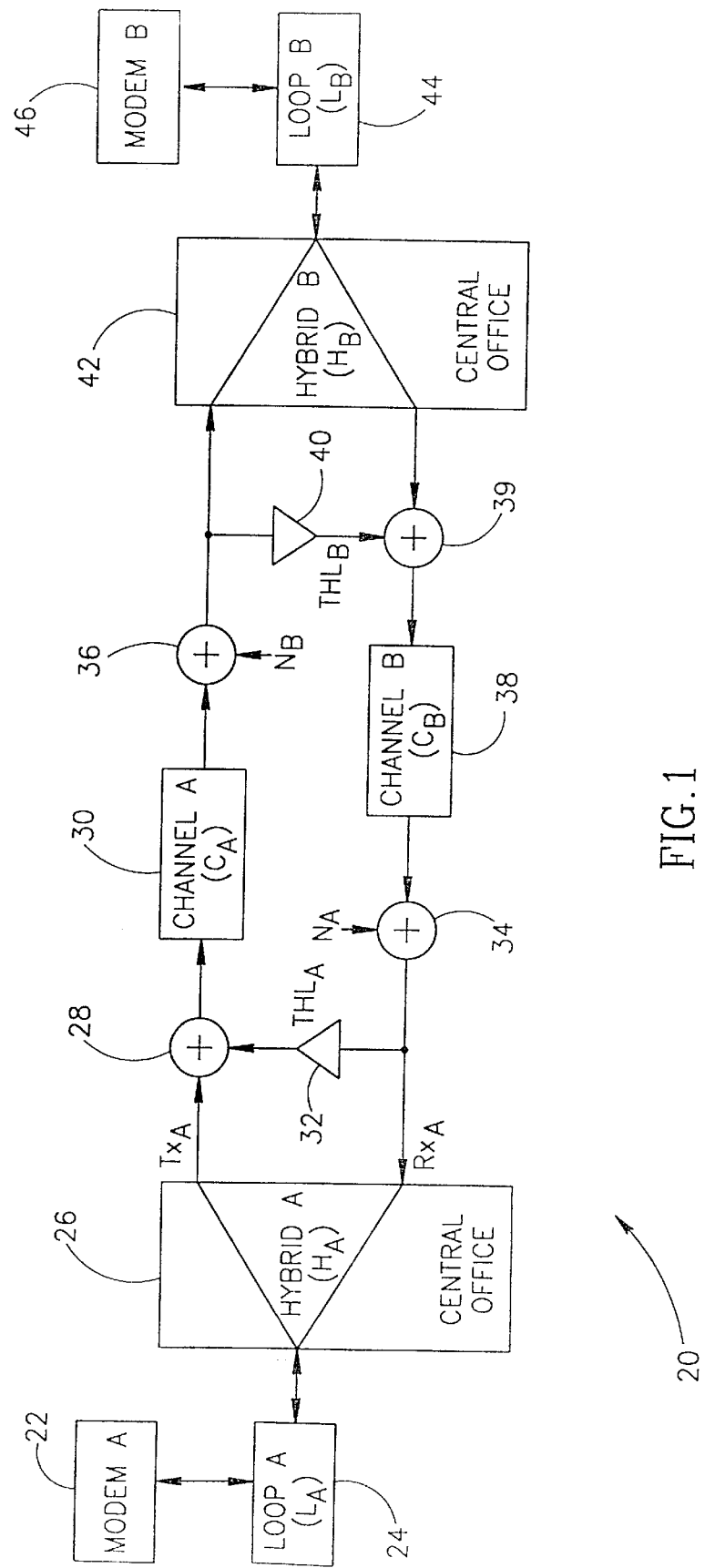
FIG. 1 is a high level block diagram illustrating a model of a voice band full duplex communication channel with impairment sources.

A high level block diagram illustrating a model of a voice band full duplex communication channel with impairment sources is shown in FIG. 1. The model comprises modem A 22 and modem B 46, local loop A ($L_A$) 24 and local loop B ($L_B$) 44, hybrid A ($H_A$) within the central office (CO) 26 and hybrid B ($H_B$) within another central office 42, channel A ($C_A$) 30 and channel B ($C_B$) 38, transhybrid loss of the signal transmitted from modem A ($THL_B$) 40 and from modem B ($THL_A$) 32 and two white gaussian thermal noise sources $N_A$, $N_B$ added to the signal path via summers 34, 36, respectively. The transhybrid 32, 40 are shown added to the signal path via summers 28, 39, respectively.

A description of the signal path to modem A is as follows. The modem is connected by a two wire line to the end office (EO) or CO via local loop 24. The local loop is modeled by a linear filter $L_A$. The EO performs 2-wire to 4-wire conversion using hybrid $H_A$ 26. The transmitted signal $Tx_A$ passes through a linear channel distortion $C_A$ 30 and after summation with white gaussian thermal noise $N_B$ produces the received signal of modem B, $Rx_B$. A 271 far-end echo is introduced by a return signal due to transhybrid loss $THL_B$ 40 at the far-end EO 42. The return signal is added to the transmitted signal from modem B, passes through channel distortion $C_B$ 38 and added to white gaussian thermal noise $N_A$ to produce the received signal $Rx_A$. The signal further undergoes a 4-wire to 2-wire conversion $H_A$ 26 and passes through the local loop $L_A$ 24.

Figure 2:
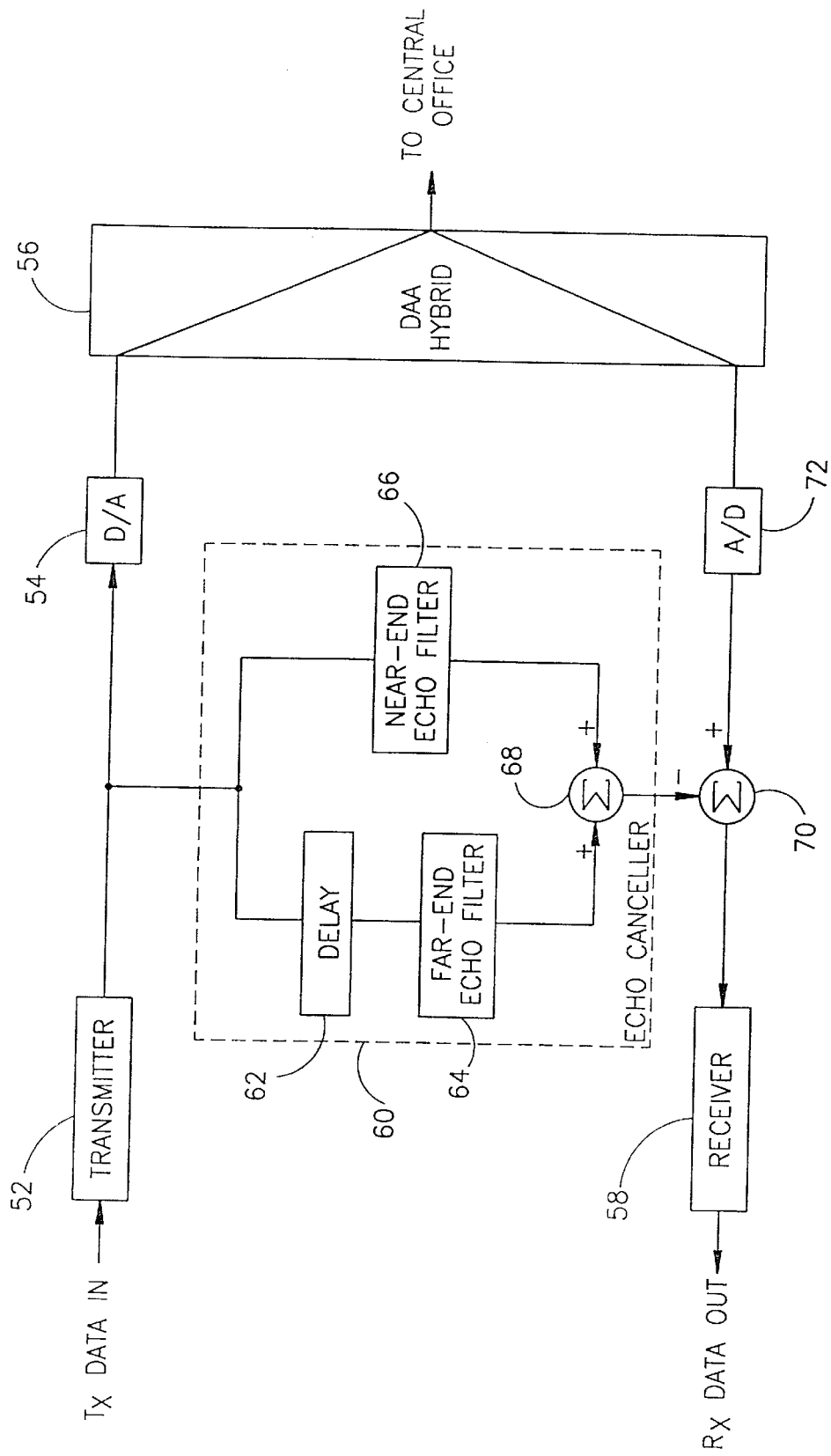
FIG. 2 is a block diagram illustrating a modem constructed in accordance with a preferred embodiment of the present invention.

A block diagram illustrating a modem constructed in accordance with a preferred embodiment of the present invention is shown in FIG. 2. The modem contains a transmitter 52, a receiver 58, an echo canceler unit 60, a summer 70, a digital to analog (D/A) converter 54, an analog to digital converter (A/D) 72 and a digital access arrangement (DAA) or hybrid 56. The echo canceler unit includes a near-end echo filter 66, a delay-line 62, a far-end echo filter 64, and a summer 68. The transmitter receives data from the transmitter data in port and outputs transmit (Tx) samples to the echo canceler and D/A. The DAA functions to match the impedance between the telephone line and the transmitter and receiver. It transforms balanced analog voltage on the two-wire pair from the end office (EO) to two two-wire unbalanced pairs, one for the transmitter and one for the receiver. The echo canceler functions to remove echoes from the received signal by applying an adaptive near-end filter to cancel the near-end echo, and an adaptive far-end filter to cancel the far-end echo. The signal at the input to the far-end filter is delayed by a delay line to match the round trip delay introduced by the network. The signals at the output of the far-end and near-end filter are summed by summer 68, to produce the echo canceler output. The output of the echo canceler is subtracted from the received signal using summer 70. The receiver functions to outputs a digital receive (Rx) data out signal.

Figure 3:
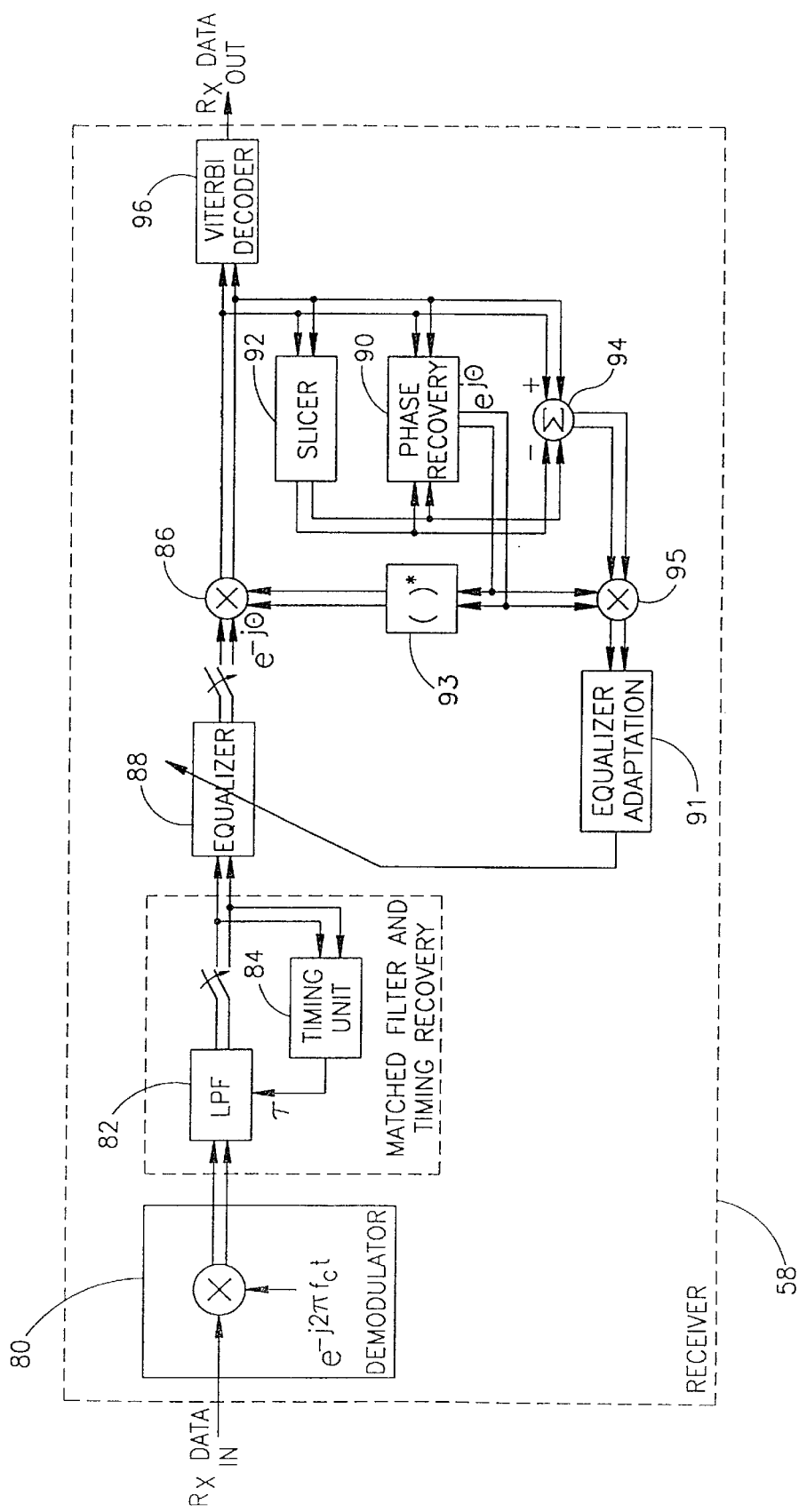
FIG. 3 is a block diagram illustrating the baseband receiver portion of the modem shown in FIG. 2.

A block diagram illustrating the receiver portion 58 of a full duplex modem is shown in FIG. 3. The receiver contains a demodulator 80, a low pass filter (LPF) 82, a timing unit 84, an equalizer 88, an equalizer adaptation unit 91, multipliers 86, 95, a phase recovery loop 90, a slicer 92, a summer 94, a complex conjugate function 93 and a Viterbi decoder 96. The input signal to the receiver 58 undergoes demodulation to generate a baseband signal. The demodulation process multiplies the received input signal with $e^{-j2\pi f_c t}$ to generate a complex baseband signal which is represented by the double lines, one line each for the real and complex portions of the output. The demodulated signal then enters the LPF to perform matched filtering with the timing unit 84 controlling the phase of the LPF in order to achieve proper symbol timing. Next, the signal is equalized using equalizer 88 which is adapted by equalizer adapter 91 in order to compensate for channel distortion. The output of the equalizer is sampled at the symbol rate and then rotated using multiplier 86 in order to compensate for carrier frequency drift over time. The equalizer output is multiplied by the complex conjugate $e^{-j\theta}$ which is the phase correction.

The output of the multiplier 86 is input to a slicer 92 which determines the best matching point in the constellation (i.e., generates a hard decision for the symbol value). The output of the multiplier 86 is also input to the Viterbi decoder 96 which performs soft decision maximum likelihood decoding of the trellis code. The output of both the multiplier and the slicer are input to the phase recovery unit 90 which calculates a complex error signal between its two inputs. This complex error signal is input to a complex conjugate function 93 which generates the signal used by the multiplier 86. The output of both the multiplier and the slicer are also input a summer 94. The output of the slicer is subtracted from its input to form the error signal which is derotated via multiplier 95, forming the error signal used to adapt the equalizer taps (i.e., so that the output of the equalizer adaptation 91 corresponds to the input to the equalizer 88). The signal input to the equalizer adaptation 91 must be derotated back to correspond with the input to the equalizer 88.

Figure 4:
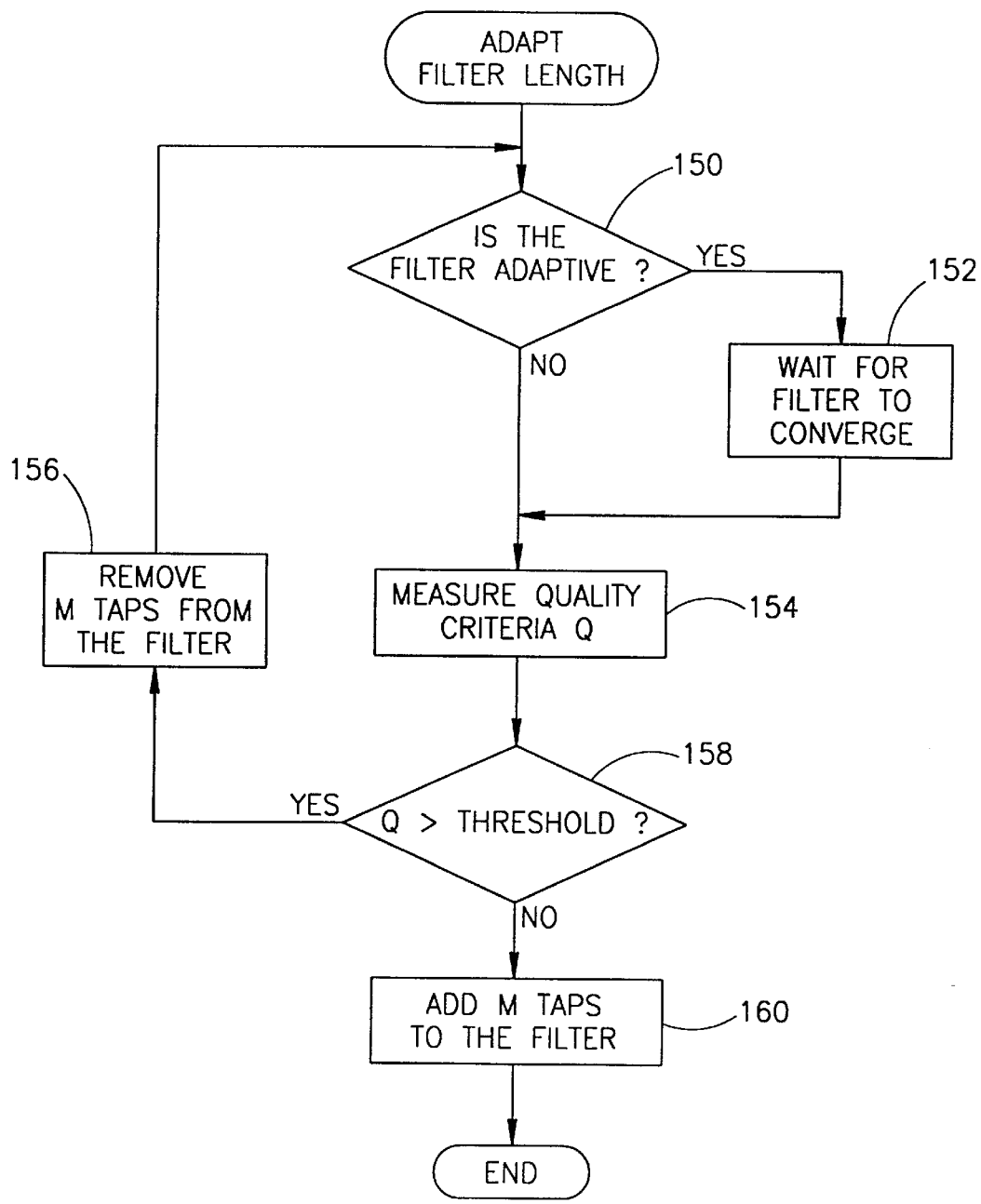
FIG. 4 is a high level flow diagram illustrating a preferred method of adapting the filter length of a filter.

A high level flow diagram illustrating a preferred method of adapting the filter length of a filter in accordance with a quality criteria is shown in FIG. 4. This method is applicable whether the filter is adaptive or not. If the filter is adaptive, the process waits for the adaptation of the filter to converge. When the filter stabilizes, the quality criteria Q is measured. The quality criteria Q can be a function of several measured parameters and may produce a plurality of outputs in which case a plurality of thresholds are considered. In the case when the filter is not adaptive the measurement can be taken immediately. Note that the measurement of the quality Q may entail several stages or require an averaging of noisy parameters to be performed, which may take additional time.

The quality criteria is checked against a plurality of predetermined thresholds. If the criteria is above the thresholds, M taps are discarded from the filters and the process is reiterated until the quality criteria fall below the thresholds. When this occurs, M taps are optionally added back to the filter to assure that the system performance quality is above the thresholds.

With reference to FIG. 4, if the filter is adaptive (step 150), the process waits for the filter to converge (step 152). Then, the quality criteria is measured (step 154). If the measured quality criteria is above the quality threshold (step 158) then M taps are removed from the filter (step 156) and the process returns to step 150. If the measured quality criteria is below the threshold, M taps are added back to the filter (step 160) and the process terminates.

Figure 5:
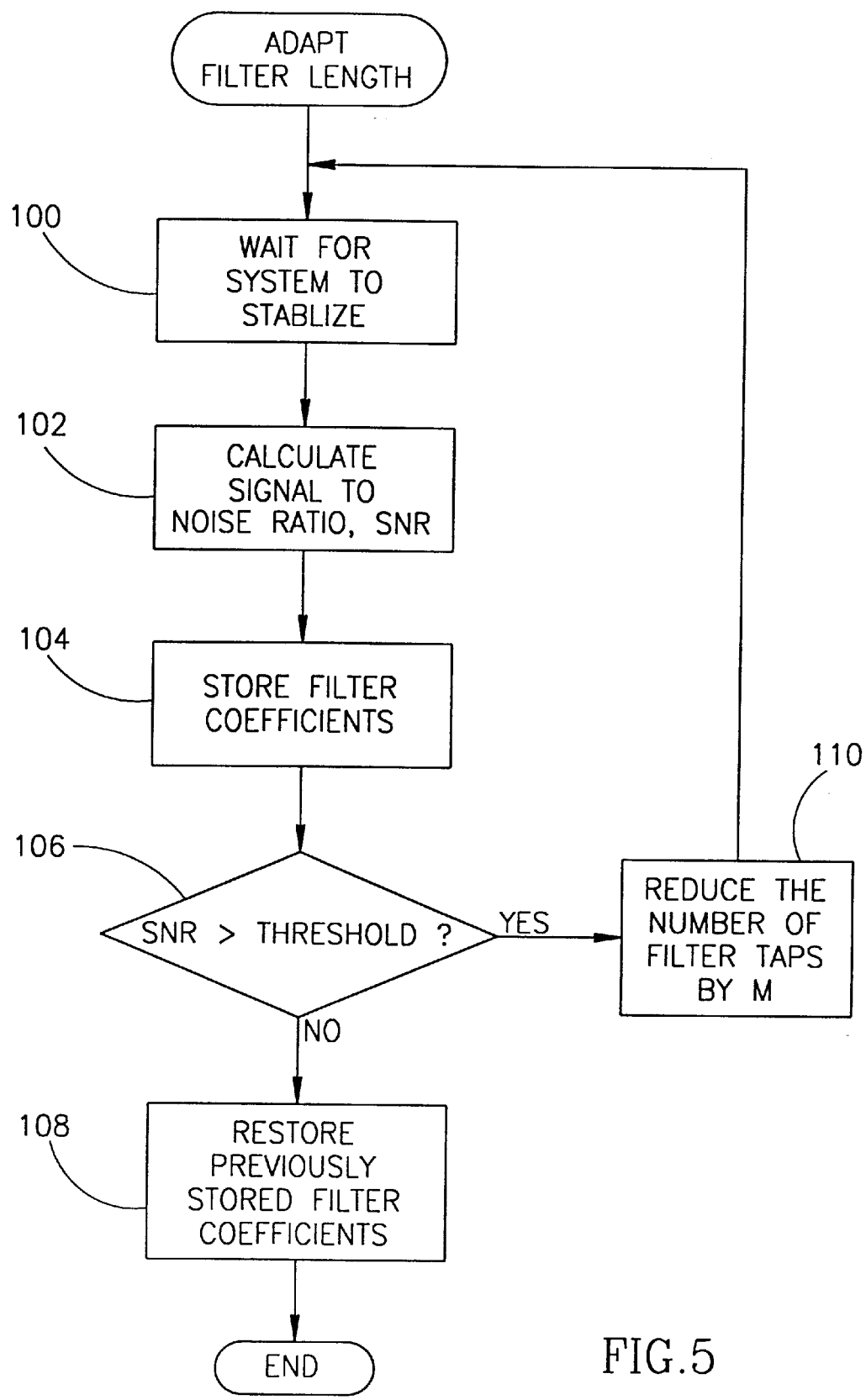
FIG. 5 is a high level flow diagram illustrating a preferred method of adapting the filter length of a filter wherein the quality criteria is the signal to noise ratio.

A high level flow diagram illustrating a preferred method of adapting the filter length of a filter wherein the quality criteria is the signal to noise ratio is shown in FIG. 5. The method disclosed in FIG. 5 is a specific case of that disclosed in FIG. 4 wherein the filter is adaptive and the quality criteria is the signal to noise (SNR) ratio of the system. First, the filter is permitted to stabilize (step 100). Then the signal to noise ratio SNR is calculated (step 102) and the coefficients of the filter are stored (step 104). If the SNR is greater than a threshold ASNR (step 106) the number of filter taps is reduced by M (step 110) and the process returns to step 100. Once the SNR is lower than the threshold, the filter coefficients are restored from the previously stored coefficients (step 108). Thus, retracing to the set of coefficients that were in use during the previous iteration of the loop.

To better illustrate the operation and utility of the filter length adaptation method of the present invention, the method is described within the framework of a full duplex voiceband modem and more specifically for the far-end echo canceler filter. However, it is noted that the example presented throughout this disclosure in no way limits the scope of the present invention. One skilled in the art may take the principles of the system and methods of the present invention disclosed herein and apply them to many other types of communications systems, those of which that are well known in the art and for any filter used therein.

The far-end (talker) echo refers to the transmit signal that has traveled around the network one time (modem A to modem B and from modem B to modem A). The model for the far-end echo channel (with reference to FIG. 1) is thus given by:

$$FE_{impairments} = L_A \cdot C_A \cdot THL_B \cdot C_B \cdot L_A$$

while the received signal impairment model is given by:

$$RX_{impairments} = L_B \cdot C_B \cdot L_A$$

The far-end echo impairment model is clearly more severe than the received signal channel impairment model. It is therefore expected that the far-end echo canceler filter needed to cancel the far-end distortion will be longer then other filters in the modem's receiver, such as the equalizer filter. Moreover, the characteristics of the channel and the local loop can vary from one communication network to another, resulting in a large range of the requisite farend echo canceler filter length in different communication scenarios. A fixed length filter designed to cope with the worst case impairment scenario will result in unnecessary CPU computing power consumption in cases were the impairments are not as severe as the worst case scenario. Therefore, the present invention discloses a method to adapt the length of the far-end filter according to the specific impairments introduced in the network.

As described previously, the present invention teaches using an SNR criteria to achieve an estimation of the desired filter length. An assumption is made that a certain amount of symbol error rate (SER) at the output of the slicer can be tolerated, especially since a coding gain is introduced by use of a trellis coding scheme which is the case in most full duplex communication standards such as the ITU V.34 standard. The SER criterion, in turn, is directly translatable to a criteria based on the SNR at the output of the slicer. In the more general case, any suitable point within the system can be used to measure the quality criteria.

The required SNR threshold ASNR is determined according to the maximal allowable BER $B_{max}$ which is determined by well known principles describing the relationship or bounds between SNR and BER.

The SNR at the output of the receiver's slicer is obtained by dividing the average power of the signal constellation points (which can be calculated beforehand by averaging the power of all the constellation points, assuming a random distribution of the received symbols) by the measurement of the power of the error signal at the slicer's output. The error signal is obtained by subtracting the hard decision symbols at the output of the slicer from the symbol values input to the slicer.

Figure 6:
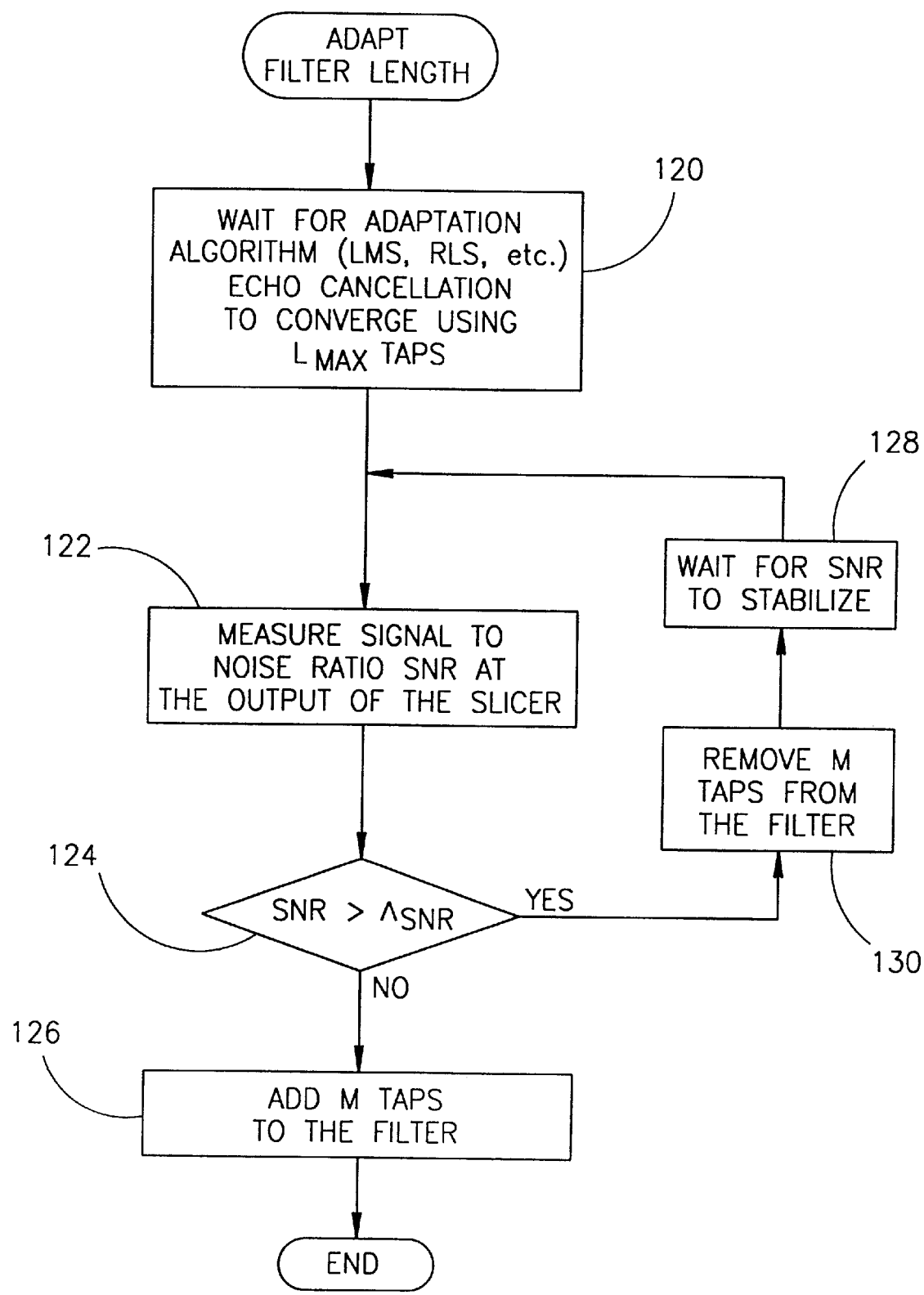
FIG. 6 is a high level flow diagram illustrating a preferred method of adapting the filter length of a filter as applied to echo cancellation.

A high level flow diagram illustrating a preferred method of adapting the filter length of a filter as applied to echo cancellation is shown in FIG. 6. This method entails decreasing the filter length gradually until the SNR at the output of the receiver's slicer reaches a predetermined threshold.

The filter is initially trained using the largest possible filter length $L_{max}$ (step 120). $L_{max}$ is determined according to the worst case coefficient spread caused by the worst case impairments scenario. After the training has converged, using the least mean squares (LMS), recursive least squares (RLS) or any other suitable adaptation algorithm, and the SNR at the output of the slicer has stabilized, the value of the SNR is measured by averaging the magnitude of the output of summer 94 (step 122). The measured SNR is then compared to the threshold SNR $\Lambda_{SNR}$ (step 124). If the SNR is larger than $\Lambda_{SNR}$, M taps are discarded from the filter (step 130). After the SNR at the slicer's output has stabilized again (step 128) the procedure is repeated. Within each iteration of the loop, M taps from the filter are removed until the SNR at the output of the slicer drops below $\Lambda_{SNR}$. Finally, once the SNR at the output of the slicer drops below $\Lambda_{SNR}$, M taps are added back to the filter in order to raise the SNR back above the threshold. During each iteration of the loop the M taps are removed alternately from the head and the tail. Correspondingly, the M taps are added back in step 126 the same way they were removed.

The method of determining the number of taps M will now be discussed. A determination of M poses a classic tradeoff. On the one hand, large values of M contribute to rapid adaptation of the process but may result in a suboptimal solution with regard to the final filter length and may ultimately lead to an unstable process. On the other hand, small values of M lengthen the process convergence time but ensure a close to optimal solution such that the SNR will approximate the required threshold $\Lambda_{SNR}$. A solution to this dilemma is to alter the value of M throughout the process such that during the last iteration the value of M is 1.

It should be noted that due to the independent nature of the filter taps during the echo cancellation process, taps can be removed or added without interfering with the adaptation process. This means that when taps are removed from the echo cancellation filter, the existing tap convergence point is not changed. Therefore, the adaptation algorithm can take place concurrently with the filter length adaptation algorithm. However, if the estimated (echo) channel characteristics are non-stationary (i.e., alters with time) it is required that the taps that are concatenated be zeroed prior to the filter's readaptation.

An advantage of the above mentioned method is its ability to establish the shortest possible filter with high accuracy. However, it has two drawbacks. The first is its slow convergence time and the second is its difficulty to cope with situations where the initial SNR value is very close to the threshold or even lower due to the fact that the estimated SNR at the slicer's output has a certain variance due to the fluctuating noise variance and the variance introduced by the adaptation algorithm. It is therefore necessary to obtain a reliable estimate of the SNR, especially when the SNR at the slicer's output is close to the threshold. This can be achieved by averaging the measurement of the SNR over a suitably large amount of time.

Thus, an additional adaptation method that gives much quicker results is taught by the present invention. This method uses an energy criteria to estimate the optimum length of the filter. The term $SNR_{old}$ designates the initial measurement of the SNR at the output of the slicer made after the far-end echo canceler LMS algorithm has converged using $L_{max}$ filter taps. We assume that the SNR at the output of the slicer is a good estimation of the SNR at the input to the receiver and is given by $$SNR_{old} = \frac{E_s}{N_c} \cdot G_p$$

where $E_s$ is the input signal power, $N_c$ the channel noise power and $G_p$ is the processing gain. The $G_p$ term is a constant for a particular receiver structure and is usually due to filtering operations. The method of a priori calculating the processing gain $G_p$ is well known in the art. $N_c$ includes all channel impairments except the far-end echo which is assumed to be made negligible by the $L_{max}$ long far-end filter. $N_e$ represents the residual far-end echo at the receiver's input that is introduced by the shortening of the far-end filter. The residual echo to channel noise ratio (RENR) can be expressed as $$RENR = \frac{N_e}{N_c}$$

It is required that the SNR at the input to the receiver after the shortening of the far-end filter, designated by $SNR_{new}$, equal the SNR threshold $\Lambda_{SNR}$. $SNR_{new}$ can then be expressed as $$SNR_{new} = \Lambda_{SNR} \cong \frac{E_s}{N_c + N_e} = \frac{\frac{E_s}{N_c}}{1 + \frac{N_e}{N_c}} = \frac{SNR_{old}/G_p}{1 + \frac{N_e}{N_c}} = \frac{SNR_{old}/G_p}{1 + RENR}$$

Solving for RENR we obtain $$RENR \cong \frac{SNR_{old}/G_p}{\Lambda_{SNR}} - 1$$

We further denote by $E_e$ the power of the signal at the output of the far-end filter and by S the power of the signal at the receiver's input. Before the far-end filter is shortened, S is given by:

$$S \cong E_s + N_c + E_c$$

Both $E_e$ and S can be measured before the far-end filter is shortened. This measurement is termed the echo to signal ratio (ESR) and is given by $$ESR = \frac{E_e}{S}$$

We further define the echo to channel noise ratio (ENR) as the following $$ENR = \frac{E_e}{N_c}$$

The ESR can then be expressed as $$ESR \cong \frac{E_e}{S} = \frac{E_e}{E_s + N_c + E_c} = \frac{E_e/N_c}{\frac{E_s}{N_c} + \frac{E_e}{N_c} + 1} = \frac{ENR}{\frac{SNR_{old}}{G_p} + ENR + 1}$$

Solving for ENR yields $$ENR \cong \frac{ESR\left(\frac{SNR_{old}}{G_p} + 1\right)}{1 - ESR}$$

The energy percentage to be discarded from the far-end filter is equal to the ratio between the power of the residual echo from the shortened far-echo filter and the power of the signal at the output of the far-end filter. This energy percentage can be expressed as $$\frac{N_e}{E_e} = \frac{N_e/N_c}{E_c/N_c} = \frac{RENR}{ENR} \cong \frac{\left(\frac{SNR_{old}/G_p}{\Lambda_{SNR}} - 1\right)}{ESR\left(\frac{SNR_{old}}{G_p} + 1\right)} \cdot (1 - ESR)$$

Figure 7:
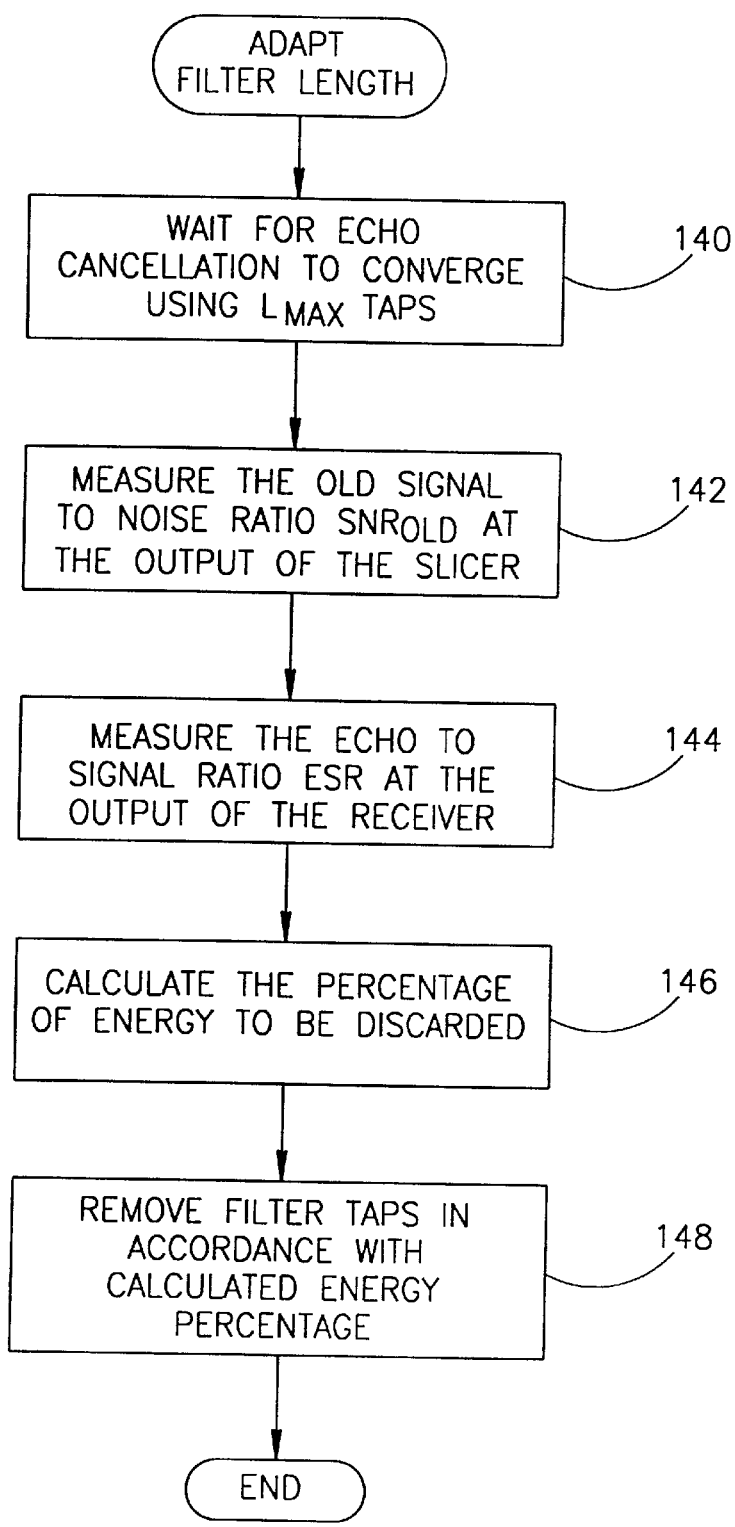
FIG. 7 is a high level flow diagram illustrating another preferred method of adapting the filter length of a filter as applied to echo cancellation.

A high level flow diagram illustrating this method of adapting the filter length of a filter as applied to echo cancellation is shown in FIG. 7. The first step is to adapt the far-end echo canceler filter using the adaptation algorithm with $L_{max}$ taps and wait for the filter to converge. Next, a measurement of $SNR_{old}$ at the output of the slicer is taken (step 142). Then the ESR is calculated by measuring far-echo signal $E_e$ the power of the signal at the output of the far-end filter and the power of the signal S at the receiver's input (step 144). Then, the energy percentage to be discarded from the far-end filter is calculated using the equation for $N_e/E_e$ given above (step 146).

Filter taps are then removed by removing a single tap from the head or tail of the filter in an alternate fashion until the energy percentage of the remaining taps with respect to the total energy of the filter equals the percentage calculated above in step 146.

The methods of FIGS. 6 and 7 are based on the assumption that the initial SNR measurement at the output of the slicer is larger than the acceptable threshold $\Lambda_{SNR}$. However, if this is not the case than the value of $\Lambda_{SNR}$ must be revised to enable the application of the algorithm. The value of $\Lambda_{SNR}$ should be lower than the initial SNR measurement by an acceptably small $\Delta_{SNR}$ factor so as not to compromise the performance of the modem.

In an alternative embodiment of the present invention the methods of FIGS. 6 and 7 can be combined together to achieve a fast and accurate adaptation of the filter's length. It is suggested to initially apply the method of FIG. 7, which provides a rapid convergence of the SNR to approximate the $\Lambda_{SNR}$ working point. Afterwards, the method of FIG. 6 can be applied to obtain a more accurate estimation.

Figure 8A:
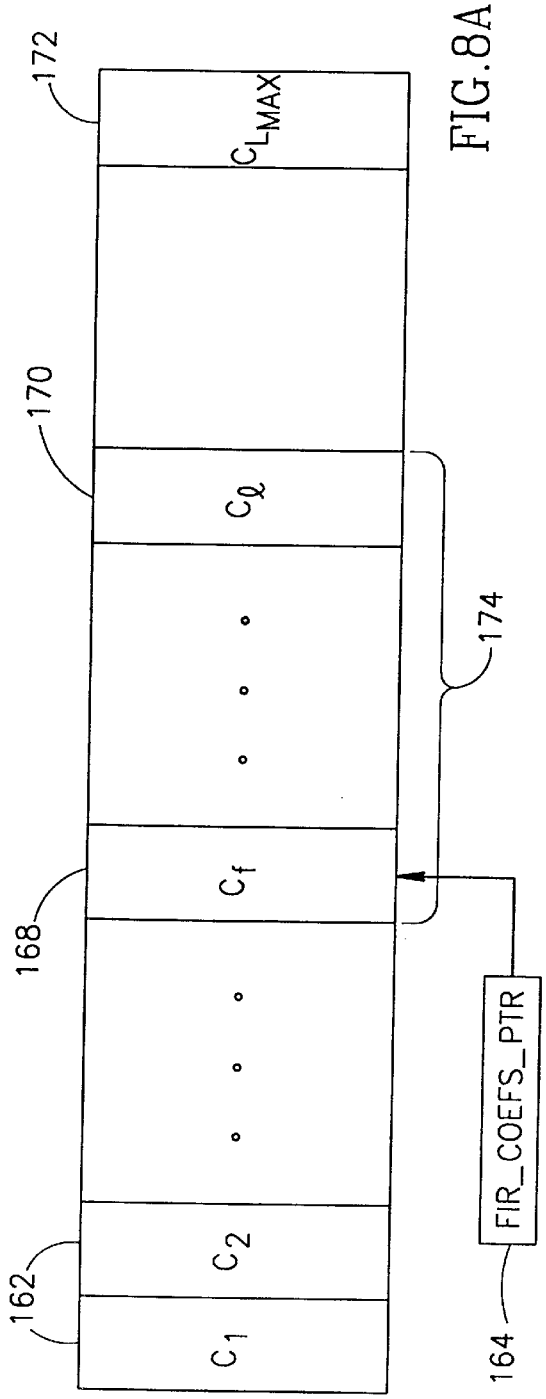
FIG. 8A is a block diagram illustrating the arrangement of the filter coefficient data structure used by the present invention.
Figure 8B:
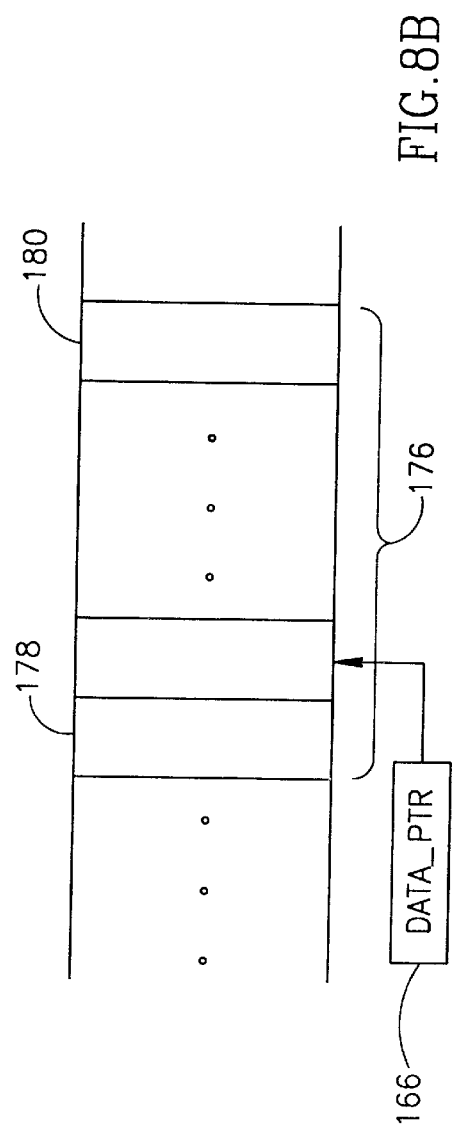
FIG. 8B is a block diagram illustrating the current data pointer pointing to a coefficient within the filter coefficient data structure.

A block diagram illustrating the arrangement of the filter coefficient data structure used by the present invention is shown in FIG. 8A. A block diagram illustrating the arrangement of the sample data input to the filter is shown in FIG. 8B. As discussed previously, the methods of the present invention enable the adaptation of the filter's length without compromising the coherency of the signal at the output of the filter. The filter's coefficients are stored in the an array called the fir_coefs array. The length of the fir_coefs array is the initial maximal filter length $L_{max}$. The filter length fir_len is a variable and represented by 174 in FIG. 8A. The filter length fir_len holds the actual length of the filter and is initialized to $L_{max}$. Two pointers are required to be maintained. One, the fir_coefs_ptr pointer 164, points to the first coefficient 168 of the current filter's coefficients vector. The second, the data_ptr 166 pointer, points to the current sample input to the filter. The current set of samples applied as input to the filter is referenced 176 in FIG. 8B and comprises a first sample 178 and a last sample 180. The data_ptr pointer is incremented so as to point to the next sample each time the filter is applied. Each time the filter is applied a fir_len point convolution is performed between the two vectors pointed to by data_ptr and fir_coefs_ptr.

The following table summarizes the manipulation of the filter length as taught by the methods of the present invention.

| | Parameter | | |
| --- | --- | --- | --- |
| Method | fir_len | fir_coefs_ptr | data_ptr |
| drop M taps from filter's head | decrement by M | increment by M | increment by M |
| add M taps from filter's head | increment by M | decrement by M | decrement by M |
| drop M taps from filter's tail | decrement by M | no operation | no operation |
| add M taps from filter's tail | increment by M | no operation | no operation |

With reference to the above table, in the event M coefficients are dropped from the filter's head, the variable fir_len is decremented by M and the fir_coefs_ptr pointer is incremented by M to step over the M deleted coefficients. In order to maintain signal coherency, the data_ptr pointer must be also be incremented by M.

In the case when M coefficients are added to the filter's head, the fir_len variable is incremented by M and the fir_coefs_ptr pointer is decremented by M to accommodate the new M coefficients. In order to maintain signal coherency, the data_ptr pointer must be decremented by M. If the LMS algorithm tracks a non-stationary (echo) channel filter, the M concatenated coefficients are set to zero prior to further LMS adaptation.

In the event M coefficients are dropped from the filter's tail, all that is needed to do is to decrement the fir_len variable by M. In the event M coefficients are added to the filter's tail, the fir_len variable is incremented by M. In case the LMS algorithm tracks a non-stationary (echo) channel filter, the M concatenated coefficients are set to zero prior to further LMS adaptation.

While the invention has been described with respect to a limited number of embodiments, it will be appreciated that many variations, modifications and other applications of the invention may be made.

What is claimed is:

1. A method of dynamically adjusting the length of a digital filter having a plurality of taps, said digital filter utilized in a system wherein said system has at least one measurable quality criteria Q. said method comprising the steps of:

measuring said at least one measurable quality criteria in said system, wherein said measurable quality criteria is derived from any point within said system other than from said dipital filter or from said plurality of taps therein;

comparing said measured at least one quality criteria against a predetermined threshold;

removing M taps from said digital filter and repeating said steps of measuring and comparing if said measured at least one quality criteria is above said predetermined threshold; and adding M taps to said digital filter if said measured at least one quality criteria is below said predetermined threshold.

2. The method according to claim 1, wherein said at least one quality criteria is a measurable signal to noise ratio at a point within said system.

3. A method of dynamically adjusting the length of an adaptive digital filter (ADF) having an adaptation procedure and a plurality of taps, said ADF utilized in a system wherein said system has at least one measurable quality criteria Q, said method comprising the steps of:

waiting for said adaptation procedure of said ADF to converge;

measuring said at least one measurable quality criteria in said system, wherein said measurable quality criteria is derived fom any point within said system other than from said adaptive digital filter or from said plurality of taps therein;

comparing said measured at least one quality criteria against a predetermed threshold;

removing M taps from said ADF and repeating said steps of measuring and comparing if said measured at least one quality criteria is above said predetermined threshold; and adding M taps to said ADF if said measured at least one quality criteria is below said predetermined threshold.

4. A method of dynamically adjusting of an adaptive digital filter (ADF) having a plurality of taps, said plurality of taps having an associated set of filter coefficients, said ADF utilized in a system wherein said system has a measurable signal to noise ratio (SNR), said method comprising the steps of:

waiting for said ADF to converge;

measuring said SNR at a suitable point in said system other than within said adaptive digital filter from said plurality of tops therein;

storing said filter coeffcients;

comparing said measured SNR against a predtermined threshold;

removing M taps from said ADF and repeating said steps of measuring and comparing if said measured SNR is above said predetermined theshold; and restoring said filter coefficients previously stored if said measured SNR is below said predetermined threshold.

5. The method according to claim 4, wherein M is equal to one.

6. A method of dynamically adjusting the length of a least mean squares (LMS) echo canceler initially having $L_{max}$ number of taps, said echo canceler utilized in a system wherein said system as at least one measurable quality criteria Q, said method comprising the steps of:

waiting for said echo canceler to converge, said echo canceler utilizing said $L_{max}$; number of taps;

measuring said at least one measurable quality criteria in said system, wherein said measurable quality criteria is derived from any point within said system other than from said echo canceler or from said taps therein;

comparing said measured at least one quality criteria against a predetermined threshold;

removing M taps from said echo canceler and repeating said steps of waiting, measuring and comparing if said measured at least one quality criteria is above said predeterined threshold; and adding M taps to said echo canceler if said measured at least one quality criteria is below said predetermined threshold.

7. The method according to claim 6, wherein said at least one quality criteria comprises the signal to noise ratio (SNR) at the output of a slicer within said system.

8. A method of dynamically adjusting the length of an adaptive echo canceler initially having $L_{max}$ number of taps, said taps having an associated set of filter coefficents, said echo canceler utilized in a system wherein said system comprises a measurable signal to noise ratio (SNR) and echo to signal ratio (ESR), said method comprising the steps of:

waiting for said echo canceler to converge, said echo canceler utilizing said $L_{max}$ number of taps;

measuring an initial SNR, called $SNR_{old}$, at a suitable point within said system;

measuring the ESR at a second suitable point within said system;

calculating a percentage of energy that can be removed from said echo canceler utilizing said $SNR_{old}$ and said ESR; and removing M taps from said echo canceler in accordance with said calculated percentage of energy.

9. In a digital filter having a length fir_len representing both the number of taps and associated coefficients, a pointer to the first coefficient represented by fir_coefs_ptr, said filter having a head and a tail, said filter processing a set of data samples wherein a pointer data_ptr points to the next sample to be processed, said digital filter utilized in a system wherein said system has at least one measurable quality criteria Q, a method of removing M taps from said head of said filter, said method comprising the steps of:

measuring said at least one measurable quality criteria in said system, wherein said measurable quality criteria is derived from any point within said system other than from said digital filter or from said plurality of taps therein;

comparing said measured at least one quality criteria against a predetermined threshold;

decrementing said filter length fir_len by M;

incrementing said pointer to the first coefficient fir_coefs_ptr by M; incrementing said data pointer data_ptr by M; and repeating said steps of measuring and comparing if said measured at least one quality criteria is above said predetermined threshold.

10. In a digital filter having a length fir_len representing both the number of taps and associated coefficients, a pointer to the first coefficient represented by fir_coefs_ptr, said filter having a head and a tail, said filter processing a set of data samples wherein a pointer data_ptr points to the next sample to be processed, said digital filter utilized in a system wherein said system has at least one measurable quality criteria Q, a method of adding M taps to said head of said filter, said method comprising the steps of:

measuring said at least one measurable quality criteria in said system, wherein said measurable quality criteria is derived from any point within said system other than from said digital filter or from said plurality of taps therein;

comparing said measured at least one quality criteria against a predetermined threshold;

incrementing said filter length fir_len by M;

decrementing said pointer to the first coefficient fir_coefs_ptr by M; and decrementing said data pointer data_ptr by M.

repeating said steps of measuring and comparing if said measured at least one quality criteria is below said predetermined threshold.

11. In a digital filter having a length fir_len representing both the number of taps and associated coefficients, said filter having a head associated with a first coefficient and a tail associated with the last coefficient, a pointer to said first coefficient represented by fir_coefs_ptr, a pointer to the next sample to be processed represented by data_ptr, a method of realizing a digital filter with M taps removed from said head of said filter, said method comprising the steps of:

decrementing said filter length fir_len by M;

incrementing said pointer to the first coefficient fir_coefs_ptr by M;

incrementing said data pointer data_ptr by M thereby reducing the number of data samples to be filtered by M; and executing the digital filter utilizing the remaining number of taps and coefficients represented by the value (fir_len−M) and the set of data samples reduced in number by M.

12. In a digital filter having a length fir_len representing both the number of taps and associated coefficients, said filter having a head associated with a first coefficient and a tail associated with the last coefficient, a pointer to said first coefficient represented by fir_coefs_ptr, a pointer to the next sample to be processed represented by data_ptr, a method of realizing a digital filter with M taps added to said head of said filter, said method comprising the steps of:

incrementing said filter length fir_len by M;

decrementing said pointer to the first coefficient fir_coefs_ptr by M;

decrementing said data pointer data_ptr by M thereby increasing the number of samples to be filtered by M; and executing the digital filter utilizing the increased number of taps and coefficients represented by the value (fir_len+M) and the set of data samples increased in number by M.

* * * * *